United States Patent [19]

Iwamuro

[11] Patent Number: 5,614,738
[45] Date of Patent: Mar. 25, 1997

[54] INSULATED GATE THYRISTOR HAVING A POLYSILICON RESISTOR CONNECTED TO ITS BASE

[75] Inventor: Noriyuki Iwamuro, Nagano, Japan

[73] Assignee: Fuji Electric Co., Ltd., Japan

[21] Appl. No.: 412,346

[22] Filed: Mar. 31, 1995

[30] Foreign Application Priority Data

| Apr. 1, 1994 | [JP] | Japan | 6-064293 |
| Jun. 20, 1994 | [JP] | Japan | 6-136766 |
| Jan. 18, 1995 | [JP] | Japan | 7-005348 |

[51] Int. Cl.$^6$ .................... H01L 29/74; H01L 29/00
[52] U.S. Cl. ................. 257/147; 257/154; 257/538; 257/537
[58] Field of Search ................. 257/147, 150, 257/154, 271, 358, 359, 360, 363, 377, 380, 382, 538

[56] References Cited

U.S. PATENT DOCUMENTS

| 4,847,671 | 7/1989 | Pattanayak et al. | 357/38 |
| 4,857,983 | 8/1989 | Baliga et al. | 357/38 |
| 4,888,627 | 12/1989 | Pattanayak et al. | 357/43 |
| 4,912,541 | 3/1990 | Baliga et al. | 357/38 |
| 4,916,507 | 4/1990 | Boudou et al. | 257/380 |
| 5,232,865 | 8/1993 | Manning et al. | 257/380 |
| 5,317,171 | 5/1994 | Shekar et al. | 257/138 |
| 5,319,222 | 6/1994 | Shekar et al. | 257/138 |
| 5,327,002 | 6/1994 | Motoyoshi | 257/380 |
| 5,400,277 | 3/1995 | Nowak | 257/380 |

FOREIGN PATENT DOCUMENTS

| 0389862A1 | 10/1990 | European Pat. Off. . |
| 3902300A1 | 1/1988 | Germany . |
| 63080572 | 4/1988 | Japan . |

OTHER PUBLICATIONS

"An Emitter Switched Thyristor with Base Resistance Control" by M.S. Shekar et al., IEEE Electron Device Letters, 14(1993)Jun., No. 6, New York.
The MOS–Gated Emitter Switched Thyristor by B. Jayant Baliga, reprinted from IEEE Electron Device Letters, vol. 11, No. 2, Feb. 1990, pp. 75–77.
High–Voltage Current Saturation in Emitter Switched Thyristors, M. S. Shekar et al., IEEE Electron Device Letters, vol. 12, No. 7, Jul. 1991, pp. 387–389.
MOS Controlled Thyristors (MCT's), V. A. K. Temple, IEDM 84, pp. 282–285 No Date.
Comparison of RBSOA of ESTs with IGBTs and MCTs, N. Iwamuro et al., Proc. of the 6th Internat. Symposium on Power Semiconductor Devices & ICs, Switzerland, May 31–Jun. 2, 1994, Session 5, pp. 195–200.
A Study of EST's Short–Circuit SOA N. Iwamuro et al., 5th International Symposium on Power Semiconductor Devices and IC's, 1993 IEEE, pp. 71–76 No Month.

*Primary Examiner*—Wael Fahmy
*Assistant Examiner*—Fetsum Abraham
*Attorney, Agent, or Firm*—Rossi & Associates

[57] ABSTRACT

An emitter switched thyristor (EST) has improved turn-off withstand capability without deteriorating its on-voltage. The EST obtains a potential drop through a resistor disposed between the main electrode and the base region and facilitates uniformly recovering the reverse-blocking ability of the PN junction, in contrast to the ESTs of the prior art which obtain the potential drop by the current in Z-direction for latching up the thyristor from the IGBT mode. The present EST may be formed also in a horizontal device or a trench structure.

12 Claims, 14 Drawing Sheets

INSULATED GATE THYRISTOR HAVING A POLYSILICON RESISTOR CONNECTED TO ITS BASE

FIELD OF THE INVENTION

The present invention relates to an insulated gate thyristor used as a power switching device.

BACKGROUND OF THE INVENTION

Thyristors have been used as indispensable devices for large capacity power conversion due to their low on-voltage characteristics. Specifically, GTO (gate turn-off) thyristors are used very often in the high-voltage large-current range applications. Drawbacks of the GTO thyristors, however, have also become clear. The drawbacks include the fact that the GTO thyristors require a large gate current for turning-off, that is a turn-off gain of the GTO thyristors is small, and the fact that the GTO thyristors require large snubber circuits for their safe turn-off. In addition, since the GTO thyristors do not show current saturation in their current-voltage characteristics, the GTO thyristors require passive components such as a fuse etc. for protecting the load from a short-circuit. This causes a bottle neck against down sizing and cost reduction of the power converting apparatuses.

AMOS control thyristor (MCT), proposed by V. A. K. Temple (IEEE IEDM Tech. Dig., 1984, p282), may be classified into a voltage drive type device. Since then, analysis and improvement of the MCT have been done world wide, since the MCT can be driven with a much simpler gate circuit than the GTO thyristors, and since the MCT turns on at low on-voltage. However, the MCTs also require passive components in their practical use, since the MCT does not show current saturation characteristics too.

M. S. Shekar et al. have experimentally shown that a dual channel type emitter switched thyristor (EST) shows current saturation characteristics up to high voltage range (IEEE Electron Device Letters, Vol. 12 (1991) p387). The inventor of the present invention analyzed the forward bias safe operation area (FBSOA) of the EST (cf. Proceedings of IEEE ISPSD '93, P71, and Proceedings of IEEE ISPSD '94, P195), and has opened up a way for developing a voltage drive type thyristor which operates safely even when a load is short-circuited. FIG. 2 is a partly perspective isometric view of an EST device developed by the present inventor.

In this device shown in FIG. 2, an $n^+$ buffer layer 2 is deposited on a $p^+$ emitter layer 1, and an $n^-$ base layer 3 is deposited on the $n^+$ buffer layer 2. In a surface layer of the $n^-$ layer 3, the first p-base region 4, a $p^+$ base region 5 which occupies a part of the first p-base region 4, and the second p-base region 6 are formed. An $n^+$ source region 7 is formed in a surface layer of the first p-base region 4, and an $n^+$ emitter region 8 is formed in a surface layer of the second p-base region 6. A gate electrode 10 is deposited on a gate oxide film 9 from above a region of the first p-base region 4 sandwiched between the $n^+$ source region 7 and an exposed area of the $n^-$ base layer 3 to above a region of the second p-base region 6 sandwiched between the $n^+$ emitter region 8 and the exposed area of the $n^-$ base layer 3. The length of the source region 7, the emitter region 8 and the gate electrode 10 is limited in Z-direction of FIG. 2, and the first p-base region 4 and the second p-base region 6 are connected outside the limited length of the source region 7, the emitter region 8 and the gate electrode 10. Outside the connection of the first p-base region 4 and the emitter region 8, the $p^+$ base region 5 extends in L-shape. A cathode 11 contacts in common with an L-shape surface of the $p^+$ base region 5 and $n^+$ source region 7. In addition, an anode 12 contacts with an entire surface of the $p^+$ emitter layer 1.

By grounding the cathode 11 of this device, and by applying positive voltage to the gate electrode 10 in a state in which the anode 12 is biassed positive, an inversion layer (partial storage layer) is formed under the gate oxide film 9 and a horizontal MOSFET is turned on. By this operation, electrons are fed from the cathode 11 to the $n^-$ base layer 3 via the $n^+$ source region 7 and the channel formed in the surface layer of the first p-base region 4. The electrons function as a base current of a PNPN transistor, consisted of the $p^+$ emitter layer 1, the $n^+$ buffer layer 2, the $n^-$ base layer 3, the first p-base region 4, the second p-base region 6, and the $p^+$ base region 5, and drives the PNPN transistor. Holes are injected from the $p^+$ emitter layer 1, and flow to the second p-base region 6 via the $n^+$ buffer layer 2 and the $n^-$ base layer 3. Then the holes flow under the $n^+$emitter region 8 in Z-direction to the cathode 11. Thus, the device operates in an IGBT mode. As the current further increases, a PN junction between the $n^+$ emitter region 8 and the second p-base region 6 is forward biased, and a built-in thyristor consisting of the $p^+$ emitter layer 1, the $n^+$ buffer layer 2, the $n^-$ base layer 3, the second p-base region 6 and the $n^+$ emitter region 8, is latched up. In turning off the EST, the MOSFET is switched off by lowering the potential of the gate electrode 10 below the threshold of the horizontal MOSFET. By this operation, the potential of the $n^+$ emitter region 8 is separated from that of the cathode 11, and the thyristor mode of operation stops.

Since the EST shows current saturation characteristics, the EST can be used for an output stage of power ICs. A horizontal structure which facilitates integrating the ESTs is disclosed in IEEE IEDM Tech. Dig. 1993 by R. Sunkavalli et al. FIG. 3 is an isometric view showing a device structure of the horizontal EST. In FIG. 3, common parts with those of FIG. 2 are designated by the same reference numerals. In FIG. 3, an oxide insulation layer 32 is deposited on an $n^+$ substrate 31, and an $n^-$ base layer 3 is deposited on the oxide insulation layer 32. In a surface layer of the $n^-$ base layer 3, the first p-base region 4, a $p^+$ base region 5, the second p-base region 6, an $n^+$ source region 7, and an $n^+$ emitter region 8 are formed. In a surface layer on the same side of the $n^-$ base layer 3, the $n^+$ buffer layer 2 and an $p^+$ emitter layer 1, with which an anode 12 contacts, are selectively formed.

As suggested by the above explanation, since the PN junction between the second p-base region 6 and the $n^+$ emitter region 8 is forward biased by the holes flowing in Z-direction of the second p-base region 6, the forward bias lowers in Z-direction as approaching the contact area of the second p-base region 6 with the cathode 11. That is, amount of the electrons injected from the $n^+$ emitter region 8 is not uniform along Z-direction. When the EST is turned off from such the on-state, the junction recovers its reverse-blocking ability from a shallowly biassed part near the contact area with the cathode 11 and delays recovering in the farthermost part from the cathode contact area. This causes current localization and lowering of the breakdown withstand capability at turning off.

FIGS. 4 and 5 are sectional views showing improved ESTs disclosed in U.S. Pat. Nos. 5,317,171 (May 31, 1994) and 5,319,222 (Jun. 7, 1994) by M. S. Shekar et al. Though the EST of FIG. 4 operates in the same way as the ESTs of FIGS. 2 and 3, a cathode 11 extends in Y-direction and contacts directly with the second p-base region 6. This configuration facilitates quick and simultaneous turning off, since the hole current in Z-direction is not utilized. However, the on-voltage of the device of FIG. 4 does not lower as expected, since minority carriers are not uniformly injected along Y-direction even if the PN junction between the $n^+$ emitter region 8 and the second p-base region 6 were biassed in forward in the thyristor mode of operation. If the impurity concentration of p-base region is decreased and its resistance is increased to solve the above described problem, sufficient withstand voltage is not obtained, since a depletion layer punches through to the $n^+$ emitter region 8 when a cathode 11 is negatively biased and an anode 12 is positively biased.

In the device of FIG. 5, though an $n^+$ emitter region 8 extends from an p-base region 6 for further lowering the on-voltage, this device structure causes insufficient forward withstand voltage.

An IGBT and a thyristor are connected in parallel in the ESTs. The on-voltage lowers with an increasing area of the thyristor. In addition, the on-voltage lowers with an increasing current amplification factor of an NPN transistor of the thyristor.

In view of the foregoing, an object of the present invention is to provide an insulated gate thyristor which facilitates uniformly recovering reverse-blocking ability of the PN junction at turning-off to increase the turn-off withstand capability and lowering the on-voltage.

SUMMARY OF THE INVENTION

The object of the present invention is achieved by an insulated gate thyristor which is comprised of: a base layer of a first conductivity type and of high resistivity; the first base region of a second conductivity type selectively formed in a surface layer on the first side of the base layer; the second base region of the second conductivity type selectively formed in the surface layer of the base layer and separated from the first base region; a source region of the first conductivity type selectively formed in a surface layer of the first base region; an emitter region of the first conductivity type selectively formed in a surface layer of the second base region; a gate electrode formed on insulation film above an exposed area of the first base region, an exposed area of the base layer and an exposed area of the second base region sandwiched between the source region and the emitter region; the first main electrode contacting in common with an exposed area of the first base region and the source region; a resistor disposed between and contacting with the first main electrode and an exposed area of the second base region; an emitter layer of the second conductivity type formed on the second side of the base layer; and the second main electrode contacting with the emitter layer.

The object of the present invention is also achieved by an insulated gate thyristor which is comprised of: a base layer of a first conductivity type and of high resistivity; the first base region of a second conductivity type selectively formed in a surface layer on the first side of the base layer; the second base region of the second conductivity type selectively formed in the surface layer of the base layer and separated from the first base region; a source region of the first conductivity type selectively formed in a surface layer of the first base region; an emitter region of the first conductivity type selectively formed in a surface layer of the second base region; a gate electrode formed on insulation film above an exposed area of the first base region, an exposed area of the base layer and an exposed area of the second base region sandwiched between the source region and the emitter region; the first main electrode contacting in common with an exposed area of the first base region and the source region; a resistor disposed between and contacting with the first main electrode and an exposed area of the second base region; an emitter layer of the second conductivity type formed in the surface layer on the first side of the base layer, the emitter layer being separated from the first base region and the second base region; and the second main electrode contacting with the emitter layer.

The emitter region is preferably wider than the source region and 25 times as wide as the source region at the maximum in a region in which the emitter region extends parallel to the source region.

It is preferable that the resistor contacts with the first electrode in an opening of insulation film sandwiched between the resistor and the first electrode, in which the opening is formed through the insulation film on above an area of the base layer sandwiched between the source region and the emitter region.

It is preferable to form a contact area of the first main electrode with the first base region and the source region in a polygon, a circle, or an ellipse.

It is preferable that a trench is dug vertically from a surface of an area between the first base region and the second base region, the base layer contacts with a bottom of the trench, the source region and the emitter regions are formed beside the trench, and the gate electrode is buried in insulator filling the trench.

The resistor is preferably comprised of poly-crystalline silicon. By contacting the first main electrode with the second base region through the resistor so as not to use the current flowing through the second base region in Z-direction for latching up the thyristor from an IGBT mode of operation and so that the PN junction between the emitter region and the second base region may recover its reverse-blocking ability uniformly along its length, current localization at turning off is avoided and the breakdown withstand capability is greatly improved.

By setting the emitter region wider than the source region so as to increase the area ratio of the main thyristor to the total device area, the area of the second base region for extracting the carrier at turning off is increased, and the on-voltage and the breakdown withstand capability are further improved. However, when the width of the emitter region exceeds 25 times of the source width, the on-voltage increases.

By forming the contact area of the first main electrode with the semiconductor structure in a polygon, a circle, or an ellipse, the area ratio of the main thyristor is increased more than the stripe contact area.

Voltage drop by the resistor is increased and the main thyristor is efficiently latched up by disposing the contact area of the first electrode and the resistor above an area of the base layer sandwiched between the source and the emitter regions so that the resistor may contact with the first electrode at a position far from the second base region.

The present invention is applicable to vertical thyristors, horizontal thyristors, and trench type thyristors.

Polycrystalline silicon, often used in the semiconductor technology, is preferably used also for the resistor of the insulated gate thyristor of the present invention.

BRIEF DESCRIPTION OF THE DRAWINGS

The invention will be described in detail with reference to the accompanying drawings, wherein.

DETAILED DESCRIPTION OF THE PREFERRED EMBODIMENTS

Figure 1:
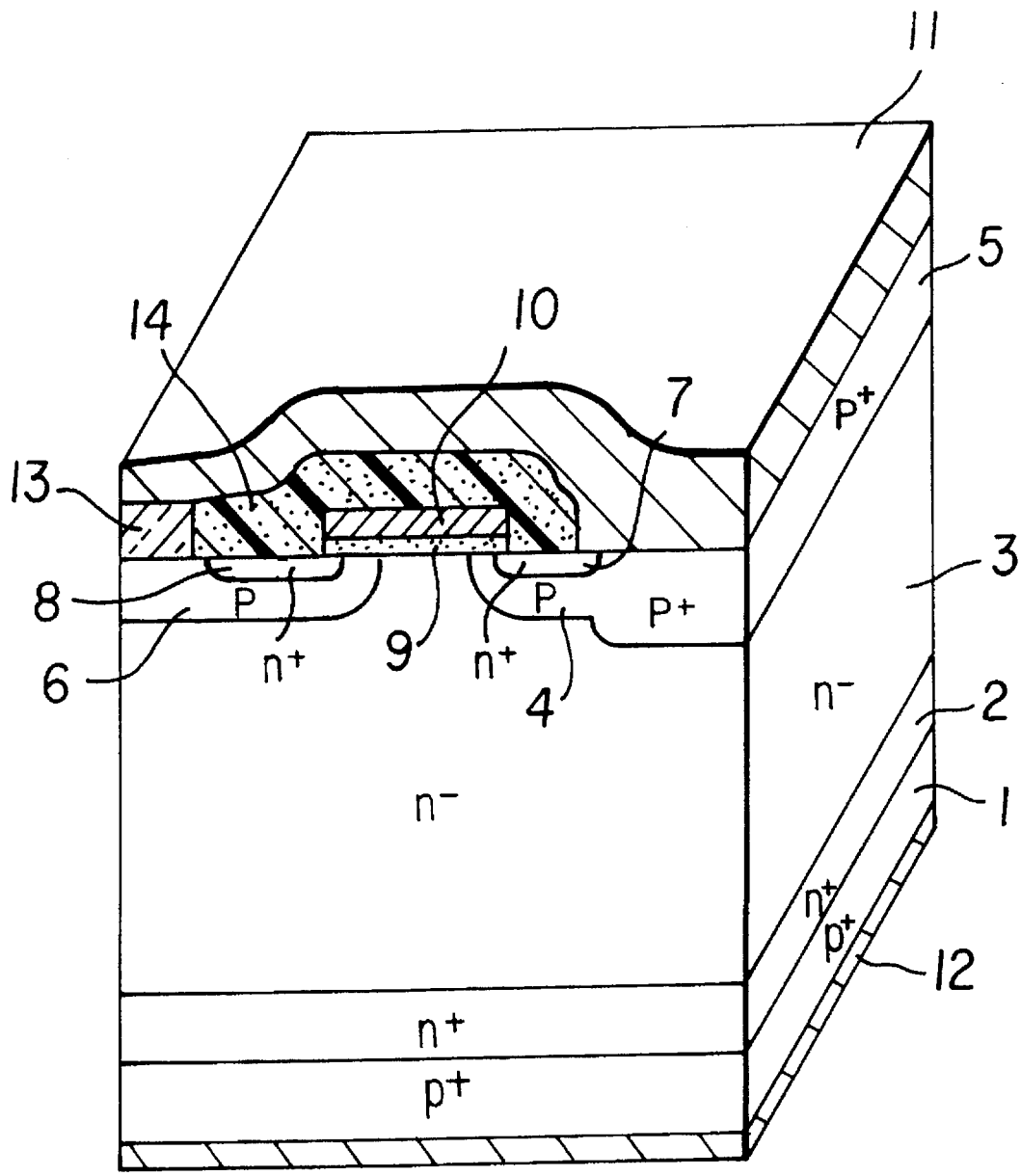
FIG. 1 is an isometric view showing the first embodiment of an insulated gate thyristor according to the present invention.
Figure 2:
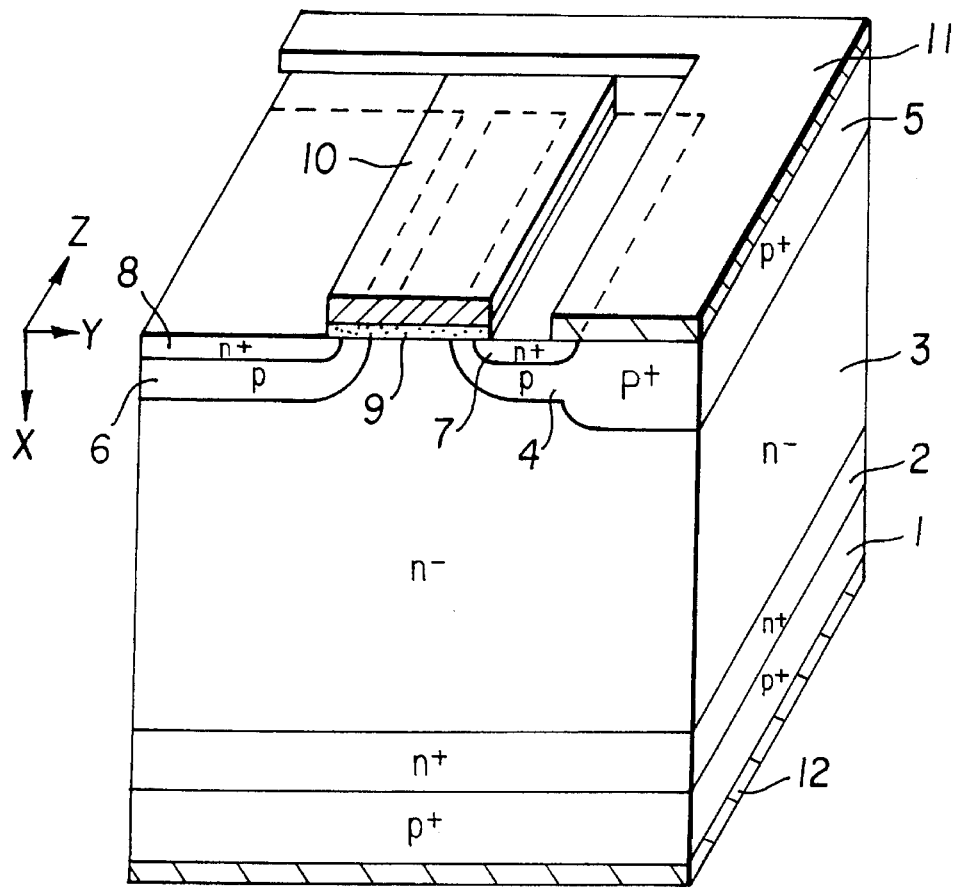
FIG. 2 is a partly perspective isometric view of an EST according to the prior art.
Figure 4:
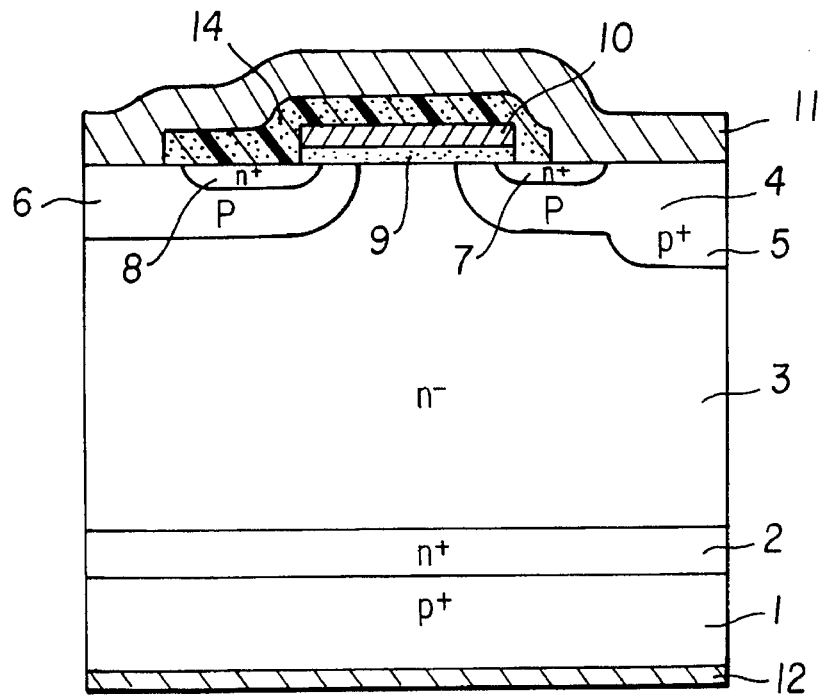
FIG. 4 is a sectional view showing an improved EST according to the prior art.

FIG. 1 is an isometric view showing a first embodiment of an insulated gate thyristor according to the present invention, in which the common parts with those of FIGS. 2 and 4 are designated by the same reference numerals. Throughout this specification, the first conductivity type designates n-type and the second conductivity type designates p-type. An elemental semiconductor structure of the insulated gate thyristor of FIG. 1 is the same with those of the ESTs of FIGS. 2 and 4. In FIG. 1, on the first side of an $n^-$ base layer 3, the first p-base region 4 and the second p-base region 6 are formed in a surface layer of the $n^-$ base layer 3. A $p^+$ base region 5 is formed in a part of the first p-base region 4 for preventing a parasitic thyristor from latching-up. On the second side of the $n^-$ base layer 3, an $n^+$ buffer layer 2 is formed, and a $p^+$ emitter layer 1 is formed on the $n^+$ buffer layer 2. An $n^+$ source region 7 is formed in a surface layer of the first p-base region 4, and an $n^+$ emitter region 8 is formed in a surface layer of the second p-base region 6. On a surface of this structure, a gate electrode 10 is formed between the $n^+$ source region 7 and the $n^+$ emitter region 8, on a gate oxide film 9, and above the first p-base region 4, the $n^-$ base layer 3 and the second p-base region 6. Thus, a horizontal MOSFET is formed. A surface of this first side is covered with an insulation layer 14 of phosphorus glass (PSG), through which a contact hole is formed. A polycrystalline silicon layer 13 as a resistor is deposited and heat treated so as to contact with the second p-base region 6 in the contact hole. The insulation layer 14 and the polycrystalline silicon layer 13 are covered with a cathode 11. The behavior of the thus formed insulated gate thyristor will be explained below.

By grounding the cathode 11, and by applying positive voltage to the gate electrode 10 in a state in which the anode 12 is biassed positive, an inversion layer (partial storage layer) is formed under the gate oxide film 9 and the horizontal MOSFET is turned on. By this operation, electrons are fed from the cathode 11 to the $n^-$ base layer 3 via the $n^+$ source region 7 and the channel of the MOSFET. The electrons function as a base current of a PNP transistor (the $p^+$ emitter layer 1/the $n^+$ buffer layer 2 and the $n^-$ base layer 3/the first and the second p-base regions 4, 6 (the $p^+$ base region 5)), and drive the PNP transistor. Holes are injected from the $p^+$ emitter layer 1, and flow to the second p-base region 6 via the $n^+$ buffer layer 2 and the $n^-$ base layer 3. Then, the holes flow through the polycrystalline Si layer 13 to the cathode 11. The potential of the second p-base region 6 is boosted by the hole current flowing through the polycrystalline Si layer 13. Electron injection from the n⁺ emitter region 8 finally starts, and a main thyristor, consisted of the p⁺ emitter layer 1, the n⁺ buffer layer 2, the n⁻ base layer 3, the second p-base region 6 and the n⁺ emitter region 8, is driven.

In turning off the EST, the MOSFET is switched off by lowering the potential of the gate electrode 10 below the threshold of the horizontal MOSFET. By this operation, the potential of the n⁺ emitter region 8 is separated from that of the cathode 11, and the thyristor mode of operation stops.

Figure 6:
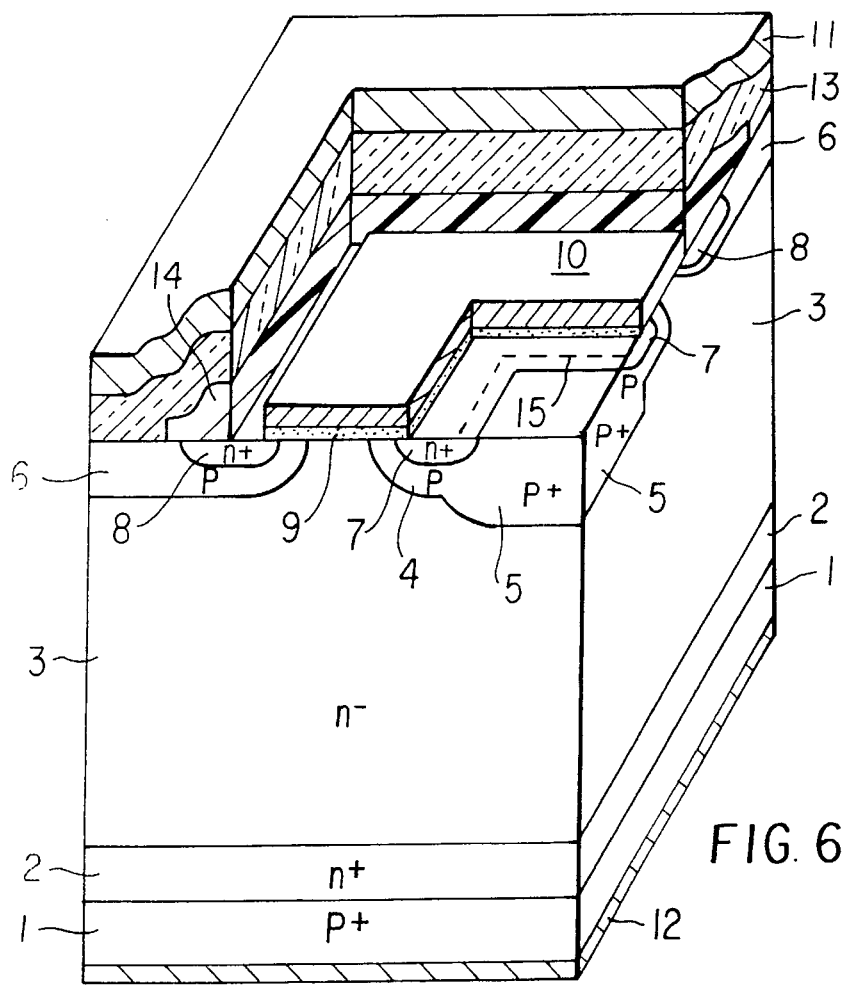
FIG. 6 is a partly sectional isometric view showing the second embodiment of an insulated gate thyristor according to the present invention.
Figure 7:
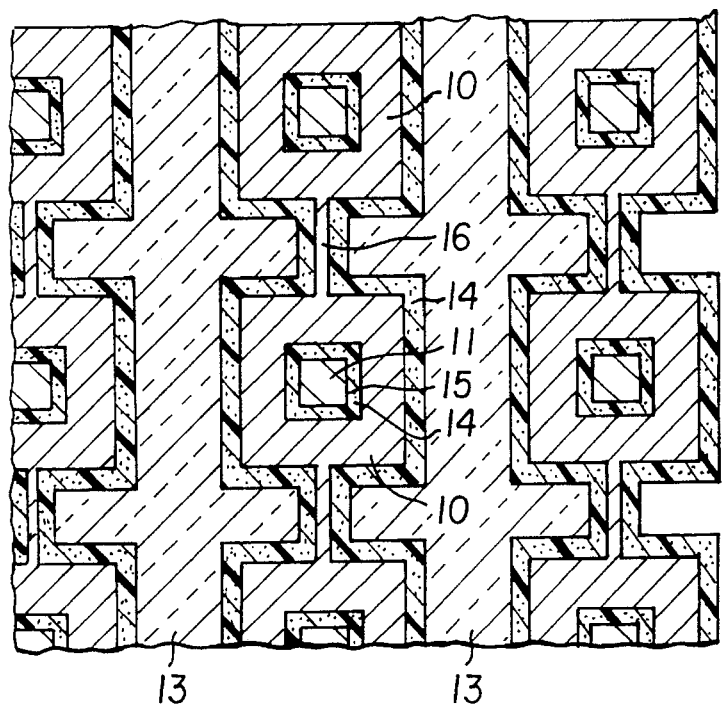
FIG. 7 is a sectional view showing arrangement of thyristor cells of FIG. 6.

FIG. 6 is a partly sectional isometric view showing a second embodiment of an insulated gate thyristor according to the present invention. In FIG. 6, a part of the device is eliminated for the sake of explanation. FIG. 7 is a sectional view on a center plane in the middle of the thickness of the gate electrode 10 of a semiconductor device including a plurality of the thyristor cells of FIG. 6. In FIGS. 6 and 7, the same parts are designated by the same reference numerals. The cathode 11 contacts with the p⁺ base region 5 and the n⁺ source region 7 in a square contact area 15 shown by broken line in FIG. 6. The gate electrode 10 is formed in a square ring surrounding the contact area 15 and is connected through gate runners 16 with adjacent gate electrodes 10, 10. The second p-base region 6 and the n⁺ emitter region 8 surrounds the gate electrode 10 in square from below the gate electrode 10. The poly-crystalline silicon layer 13 surrounds the gate electrode 10 through the PSG interlayer insulation layer 14, and contacts with the second p-base region 6. Since this configuration increases the contact area of the polycrystalline silicon resistor 13 with the second p-base region 6 and the area ratio of the main thyristor to the total device area, the on-voltage of the insulated gate thyristor is lowered.

Figure 8:
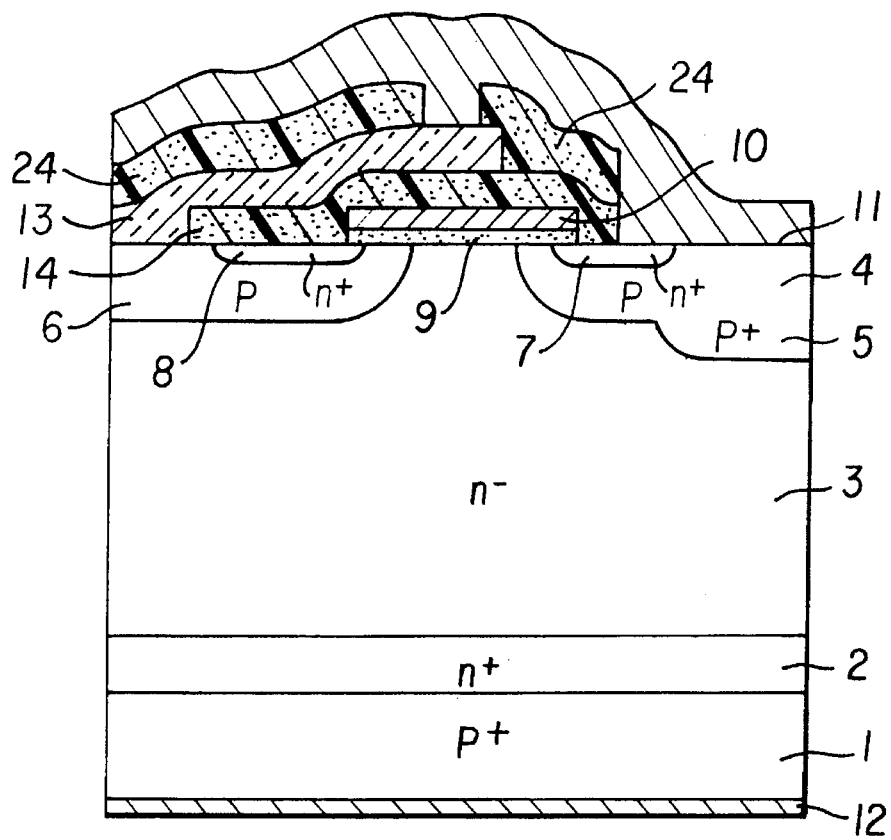
FIG. 8 is a sectional view showing the third embodiment of an insulated gate thyristor according to the present invention.
Figure 9:
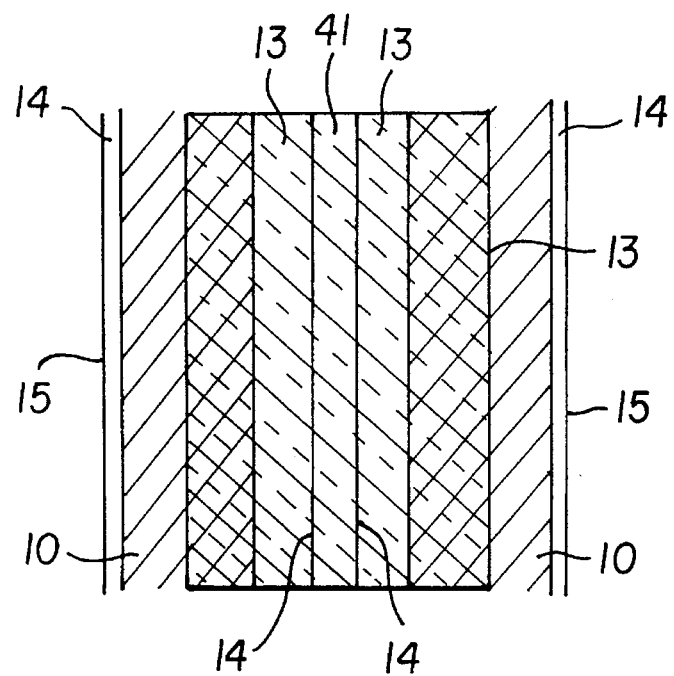
FIG. 9 is a top plan view of a stripe cell of Fig. 8.
Figure 10:
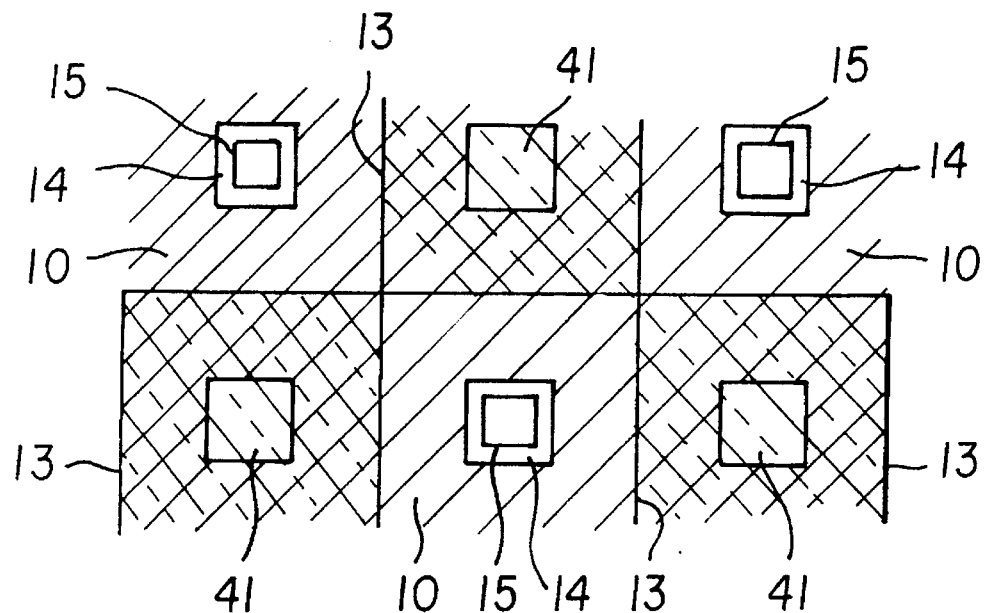
FIG. 10 is a top plan views showing device pattern of square cells.
Figure 11:
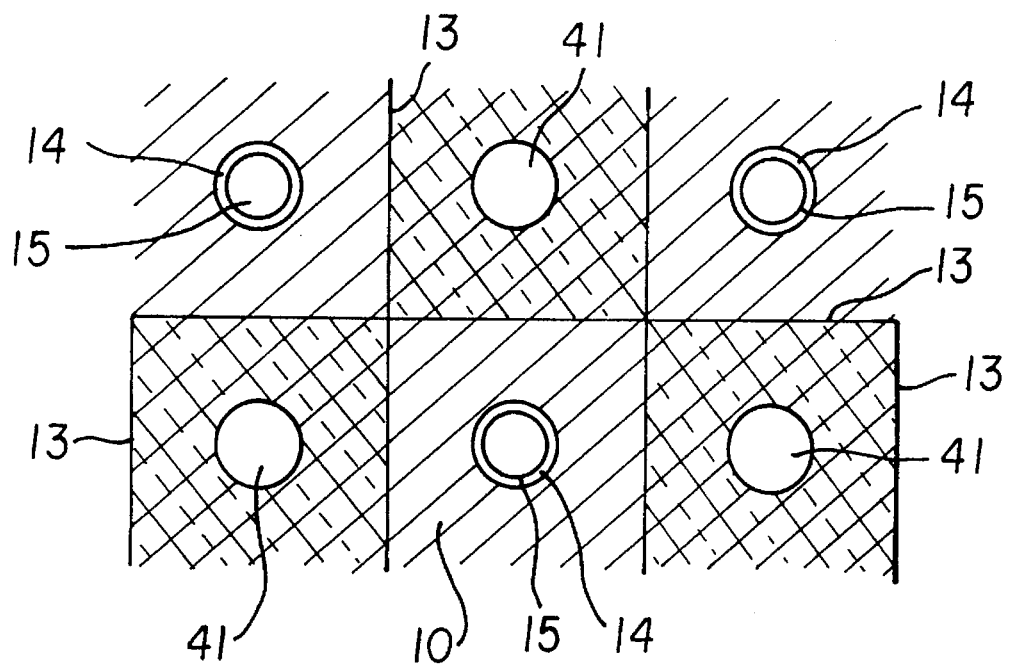
FIG. 11 is a top plan views showing device pattern of circular cells.
Figure 12:
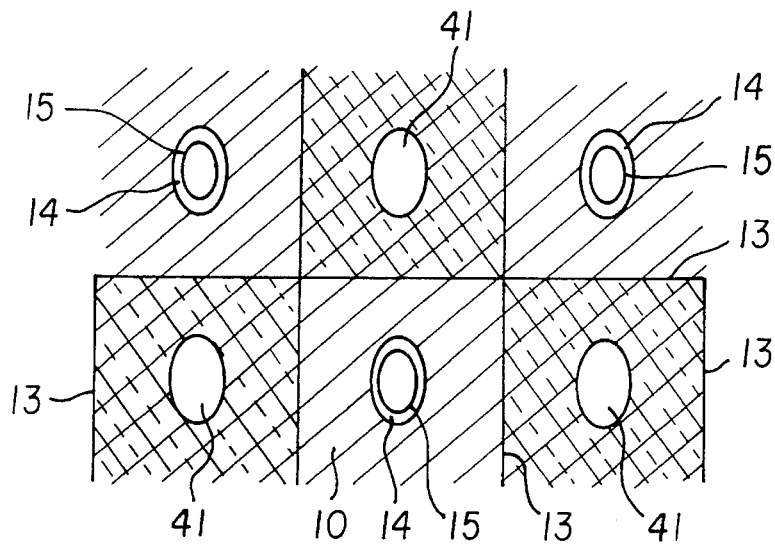
FIG. 12 is a top plan views showing device pattern of elliptical cells.

FIG. 8 is a sectional view showing a third embodiment of an insulated gate thyristor according to the present invention. In FIG. 8, the spacing between the polycrystalline silicon resistor 13 and the cathode 11 is elongated by a silicon oxide insulation layer 24 of 0.7 μm in thickness inserted between the resistor 13 and the cathode 11 to efficiently realize potential drop through the polycrystalline silicon resistor 13. FIG. 9 is a top plan view of a stripe cell of FIG. 8. In FIG. 9, the gate electrode 10 and the resistor 13 are illustrated by hatched areas, and the resistor 13 contacts with the semiconductor structure in an area 41. FIGS. 10, 11, and 12 are top plan views showing device patterns respectively of square cells, circular cells, and elliptic cells.

Figure 5:
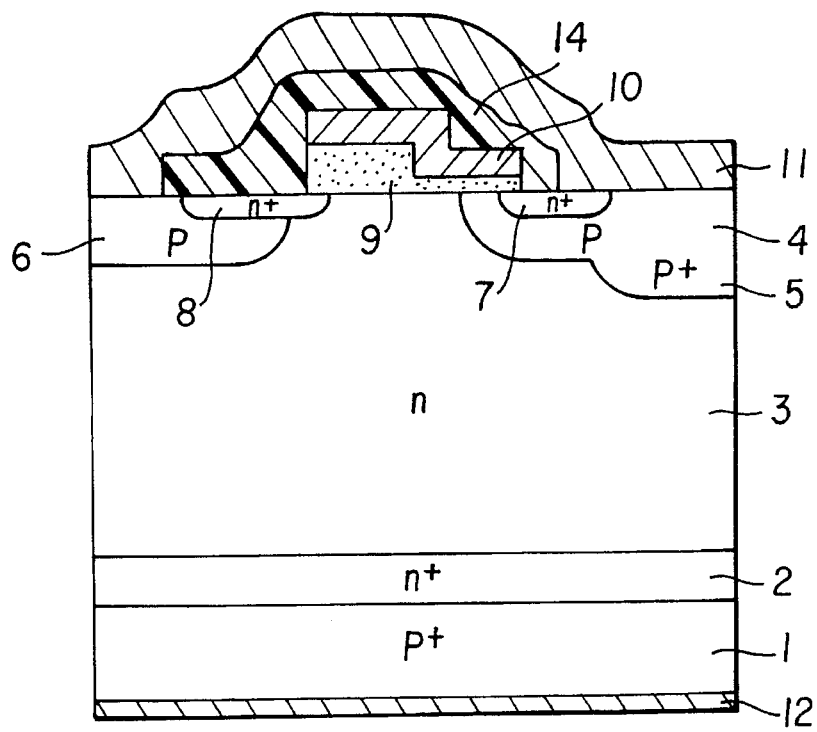
FIG. 5 is a sectional view showing another improved EST according to the prior art.
Figure 13:
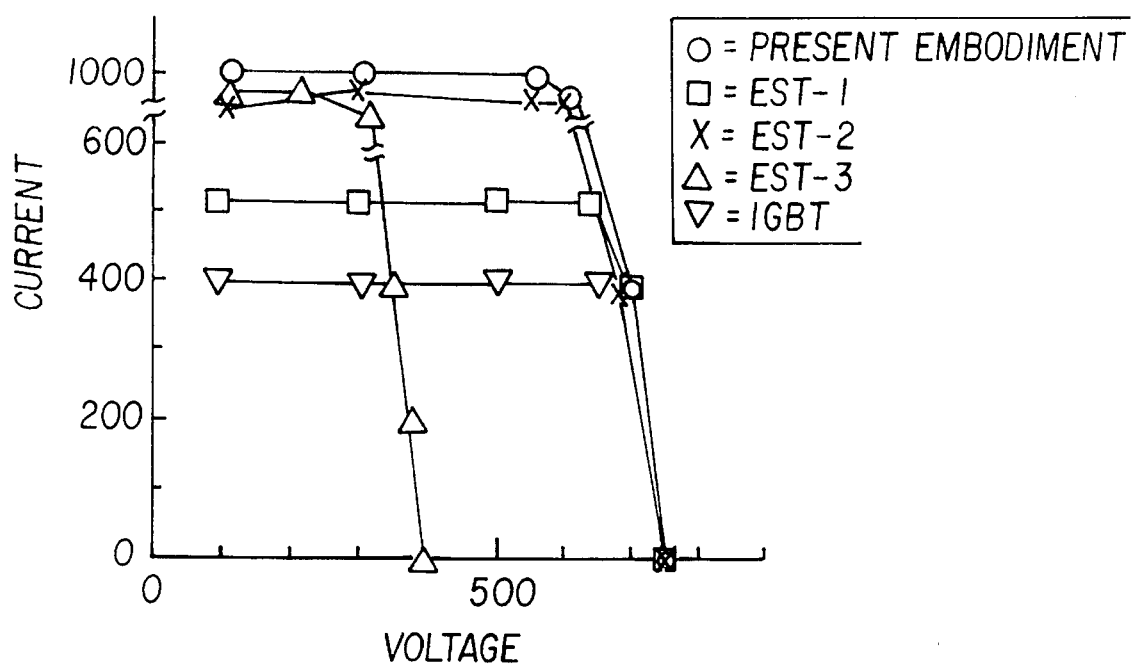
FIG. 13 is a voltage-current diagram comparing the reverse bias safe operation area (RBSOA) of the 600 V-class device of the present invention with the devices according to the prior art.
Figure 14:
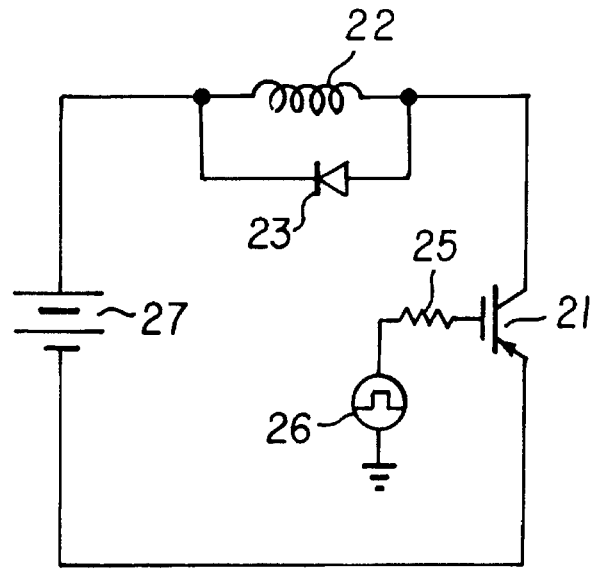
FIG. 14 is a diagram showing a circuit for measuring RBSOA.

FIG. 13 is a voltage-current diagram which compares the reverse bias safe operation area (RBSOA) of the devices of FIGS. 6 and 9 with the insulated gate thyristors according to the prior art shown in FIG. 2 (hereinafter referred to as "EST-1"), FIG. 4 (hereinafter referred to as "EST-2") and FIG. 5 (hereinafter referred to as "EST-3"), and of an IGBT. The RBSOA were measured at 125° C. with a circuit shown in FIG. 14. In FIG. 14, a device 21 to be measured is connected through inductance 22 of 1 mH and a Wheatstone bridge 23 connected in parallel with each other to a DC power supply 27. A gate of the device 21 is connected with a gate power supply 26 through a resistor 25 of 25Ω. The device 21 is manufactured as a 600 V-class device which uses a wafer comprised of an n⁺ buffer layer of 0.1Ω·cm in resistivity and of 10 μm in thickness epitaxially grown on a p⁺ silicon substrate of 0.02Ω·cm in resistivity and of 450 μm in thickness, and an n⁻ base layer of 40Ω·cm in resistivity and of 55 μm in thickness epitaxially grown on the n⁺ buffer layer. Length of the n⁺ emitter region 8 is 6 μm, and length of the n⁺ source region 7 is 14 μm. Emitter width of all the EST devices is 20 μm. Chip size of these five devices is 1 cm². The on-voltage, defined by the potential drop when a current of 100 A flows through the device, is 0.9 V for the devices of FIGS. 6 and 9, 1.6 V for the EST-1, 1.7 V for the EST-2, 1.0 V for the EST-3, and 2.3 V for the IGBT. As indicated by FIG. 13, the devices of the present invention show on-voltage lower than those of the other four devices of the prior art and breakdown withstand capability 2.5 times as high as that of the IGBT and twice as high as that of the EST-1. This is due to that the PN junction between the n⁺ emitter region 8 and the second p-base region 6 simultaneously recovers the reverse-blocking ability over its length, and then the second p-base region 6 functions as a bypass of the hole current.

Figure 15:
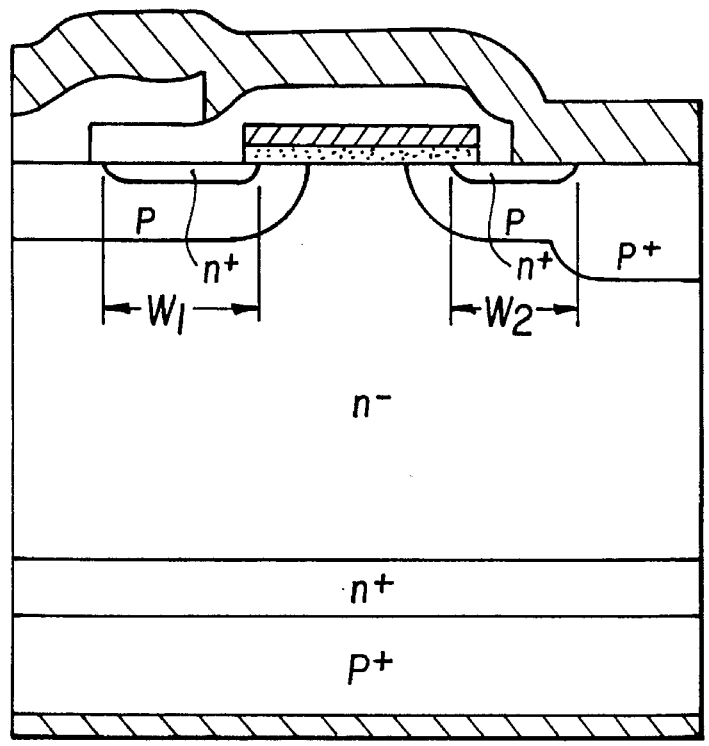
FIG. 15 is a sectional view showing an embodiment of a 600 V-class insulated gate thyristor (the fourth embodiment) of the present invention.
Figure 16:
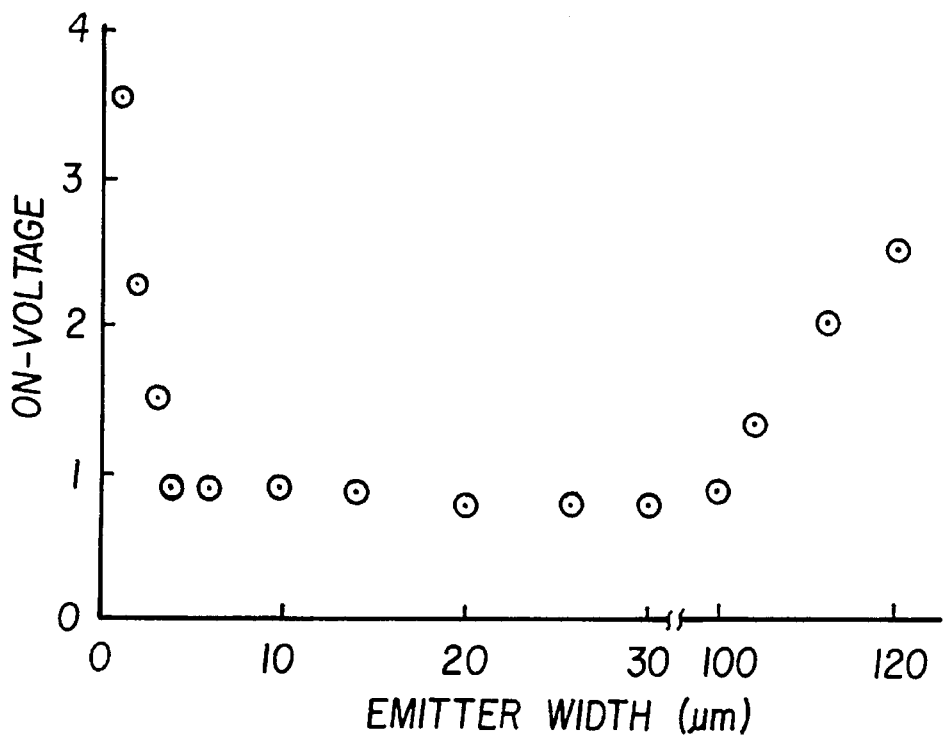
FIG. 16 is a graph showing the relation between the width $w_1$ of the $n^+$ emitter region and the on-voltage of the 600 V-class device of FIG. 15.
Figure 17:
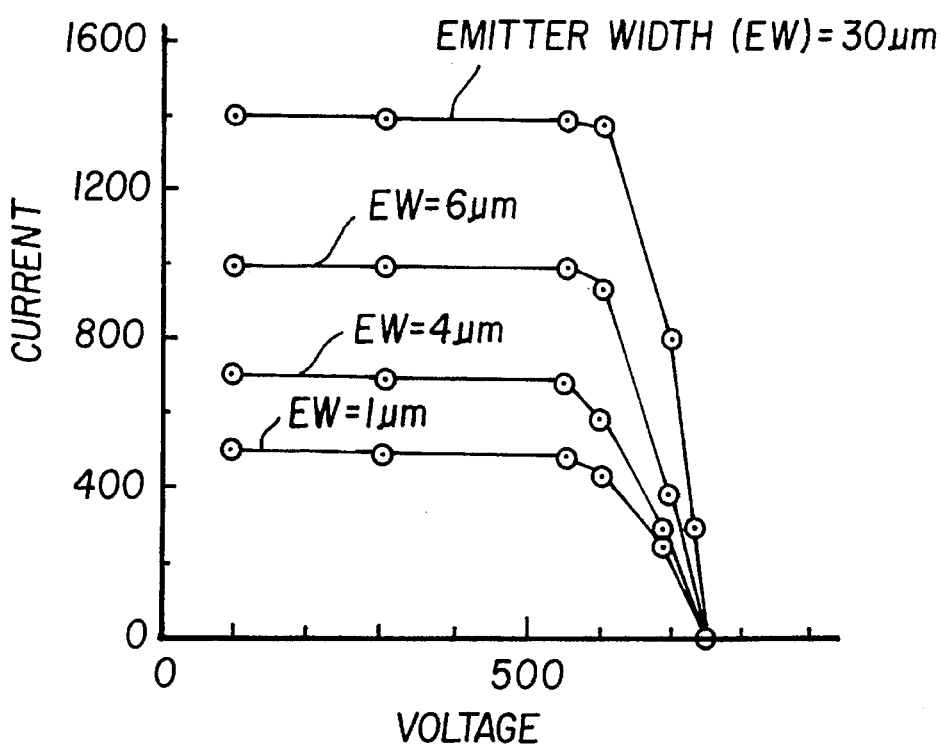
FIG. 17 is a voltage-current diagram showing the dependence of breakdown withstand capability on the width $w_1$ of the $n^+$ emitter region of the device of FIG. 15.

FIG. 16 is a graph showing the relation between the width $w_1$ of the n⁺ emitter region and the on-voltage of an embodiment of a 600 V-class insulated gate thyristor according to the present invention shown in FIG. 15. And FIG. 17 is a voltage-current diagram which shows the dependence of breakdown withstand capability on the width $w_1$ of the n⁺ emitter region of the device of FIG. 15. The length of the n⁺ source region and the source width $w_2$ are set at 4 μm. As FIGS. 16 and 17 indicate, the on-voltage and the breakdown withstand capability are improved by widening the emitter width $w_1$ beyond the source width $w_2$. These improvements are attributed to increase of electrons injected from the n⁺ emitter region 8, the area ratio of which is increased in a unit cell, and to increase of holes extracted at turning off by relative increase of the second p-base region 6 in association with the increase of the emitter width $w_1$. However, when $w_1$ exceeds 100 μm, on-voltage starts increasing. This is because of increase in necessary voltage for turning on the thyristor with increase in the occupied area ratio of the IGBT in the unit cell.

Figure 18:
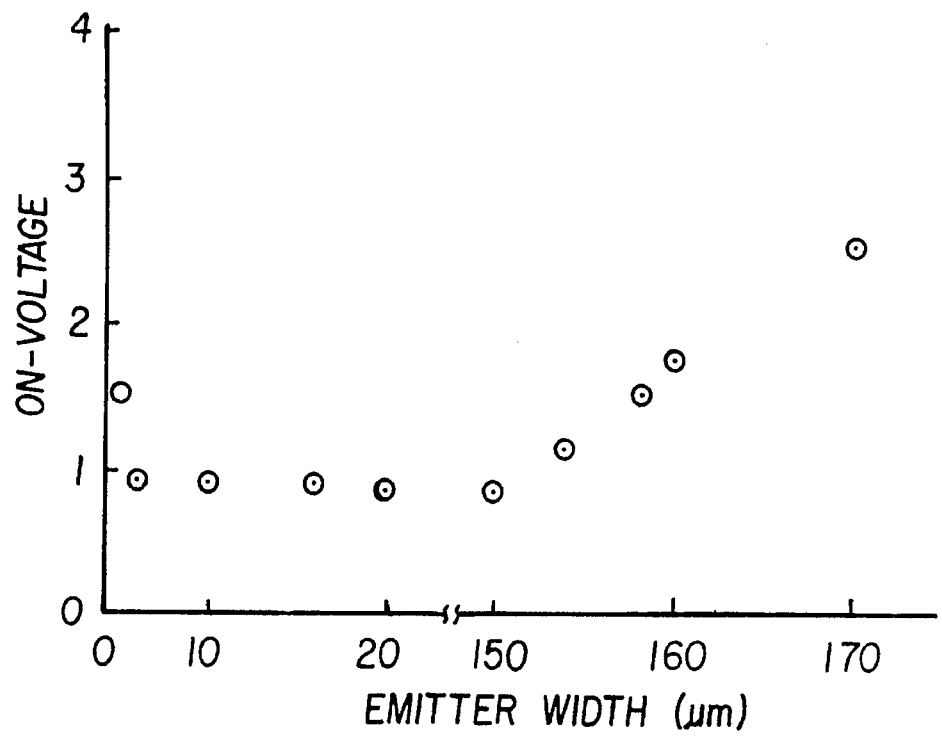
FIG. 18 is a graph showing the relation between the width $w_1$ of the $n^+$ emitter region and the on-voltage of the 600 V-class device of FIG. 15, the source width $w_2$ of which is 6 μm.
Figure 19:
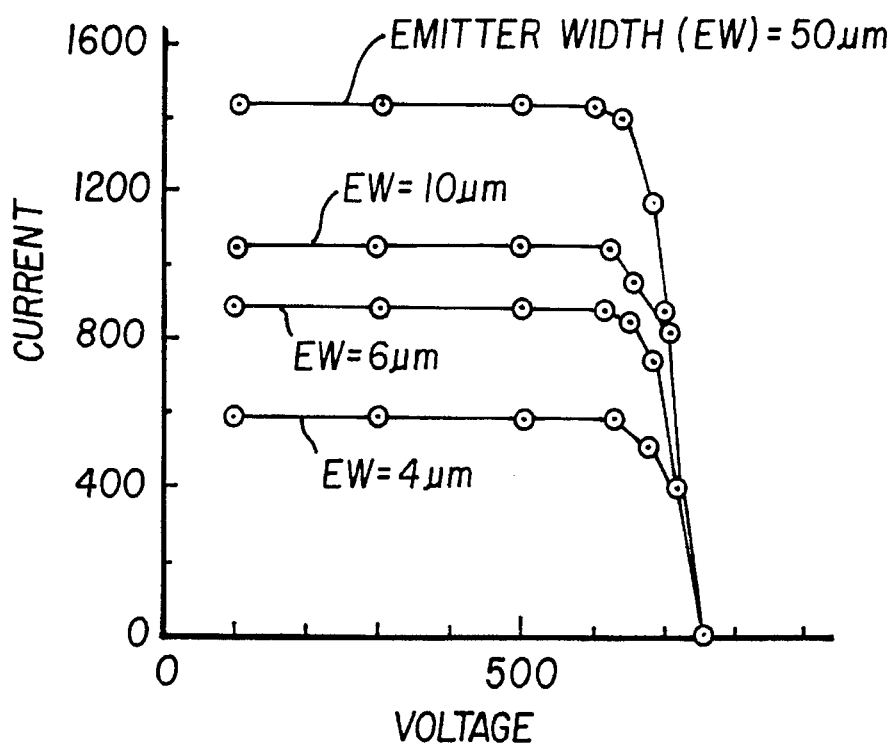
FIG. 19 is a voltage-current diagram showing the dependence of breakdown withstand capability on the width $w_1$ of the $n^+$ emitter region of the 600 V-class device with $w_2$ of 6 μm.
Figure 20:
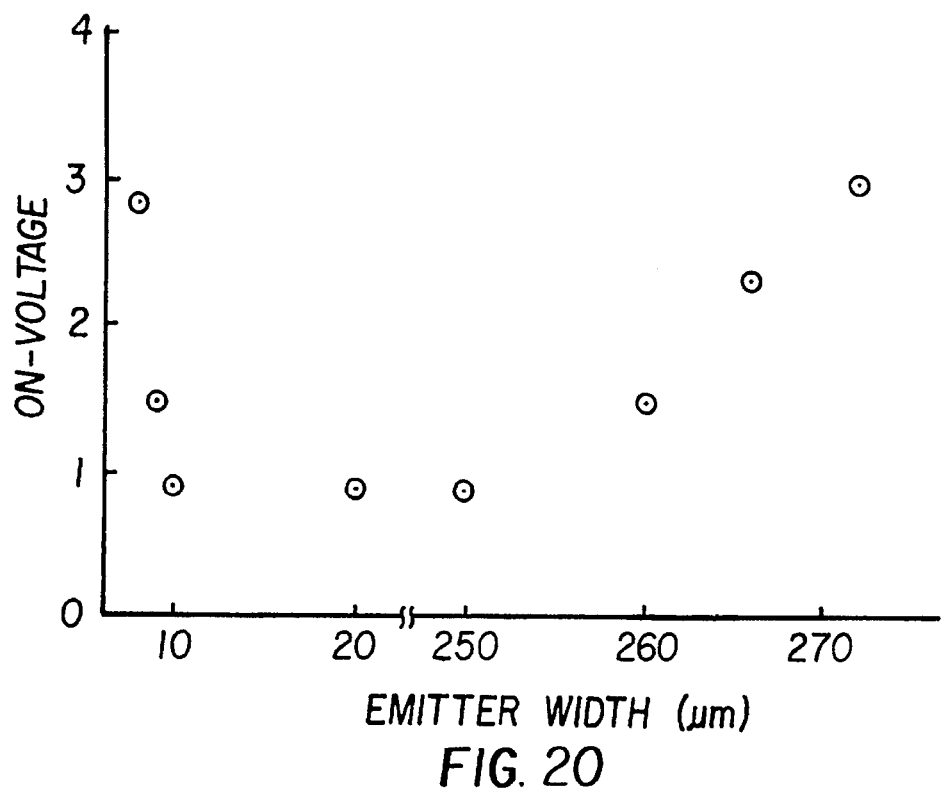
FIG. 20 is a graph showing the relation between the width $w_1$ of the $n^+$ emitter region and the on-voltage of the 600 V-class device, the source width $w_2$ of which is 10 μm.
Figure 21:
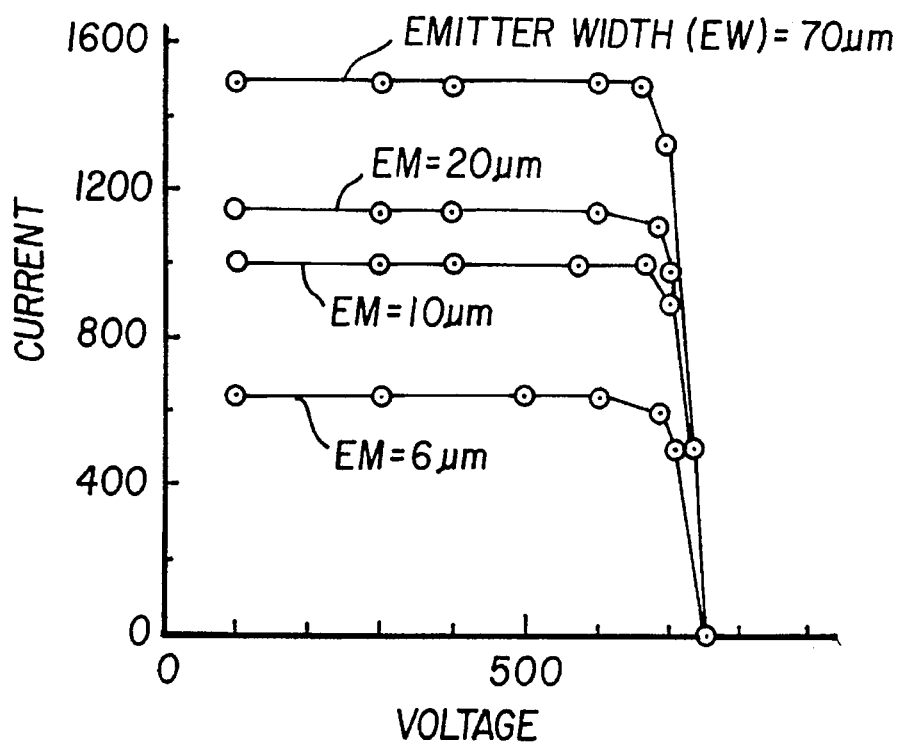
FIG. 21 is a voltage-current diagram showing the dependence of breakdown withstand capability on the width $w_1$ of the $n^+$ emitter region of the 600 V-class device with $w_2$ of 10 μm.

FIGS. 18 is a graph showing the relation between the width $w_2$ of the n² emitter region and the on-voltage of a 600 V-class insulated gate thyristor, the source width $w_2$ of which is 6 μm, and FIG. 19 is a voltage-current diagram which shows the dependence of breakdown withstand capability on the width $w_1$ of the n⁺ emitter region of the 600 V-class device with $w_2$ of 6 μm. FIG. 20 is a graph showing the relation between the width $w_1$ of the n⁺ emitter region and the on-voltage of a 600 V-class insulated gate thyristor, the source width $w_2$ of which is 10 μm, and FIG. 21 is a voltage-current diagram which shows the dependence of breakdown withstand capability on the width $w_1$ of the n⁺ emitter region of the 600 V-class device with $w_2$ of 10 μm. FIGS. 18, 20, and FIGS. 19, 21 show similar results with that of FIG. 16 and FIG. 17 respectively. These figures indicate that the on-voltage starts increasing from $w_1$ of around 25 times or more as wide as $w_2$.

Table 1 lists measured on-voltage and breakdown withstand capability represented by the maximum turn-off current at VAK of 500 V of the devices of FIGS. 7, 10, 11, and 12. The emitter width $w_1$ is 10 μm, and the source width $w_2$ is 4 μm for each device.

TABLE 1

| Cell shape | Quadrangle | Hexagonal | Octagonal | Dodecagonal | Circular | Elliptic |
|---|---|---|---|---|---|---|
| On-voltage(V) (at 100 A/cm$^2$) | 0.85 | 0.84 | 0.84 | 0.84 | 0.85 | 0.88 |
| Breakdown withstand capability (A) | 1010 | 1001 | 1015 | 1015 | 1018 | 1000 |

By forming the cathode contact region 15 in square as shown in FIGS. 7 and 10, the area ratio of the main thyristor increases, the PN junction between the n$^+$ emitter region 8 and the second p-base region 6 uniformly recovers its reverse-blocking ability, and the hole current flows through the p-base region 6. As a result, the on-voltage and the breakdown withstand capability are improved as described in Table 1 and in FIG. 13. Similar results are obtained by the polygonal cells having more corners, the circular cell of FIG. 11, and the elliptic cell of FIG. 12.

Figure 22:
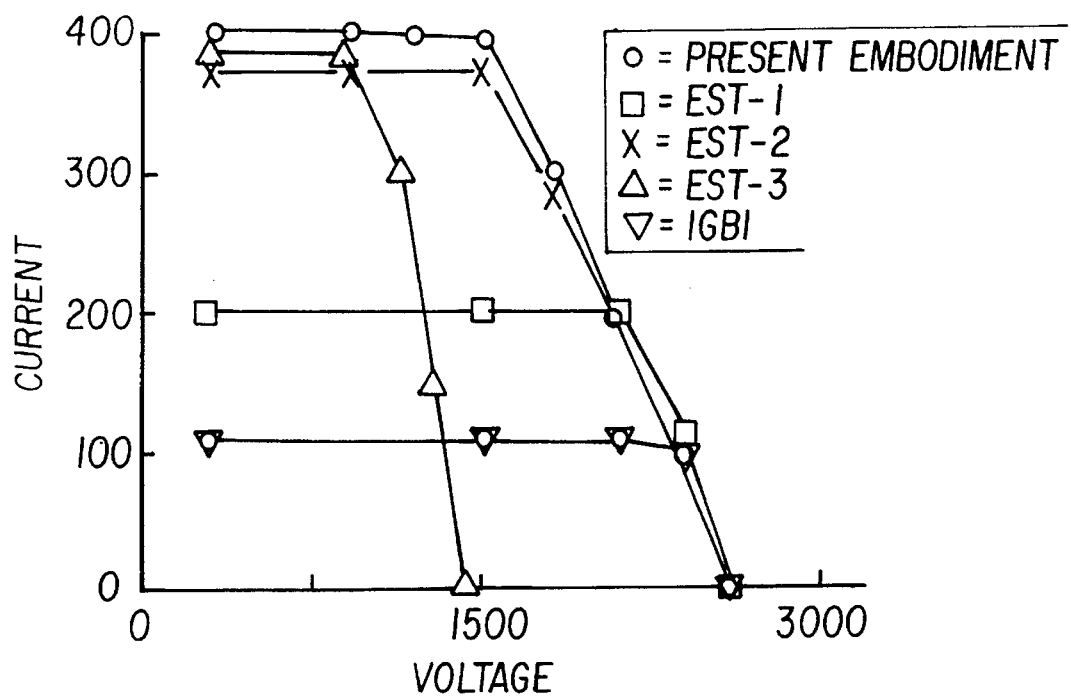
FIG. 22 is a voltage-current diagram comparing the RBSOA at 125° C. of the 2500V-class device of the present invention having the structure shown in FIG. 15 with those of an EST-1, an EST-2, an EST-3, and an IGBT of 2500V-class.
Figure 23:
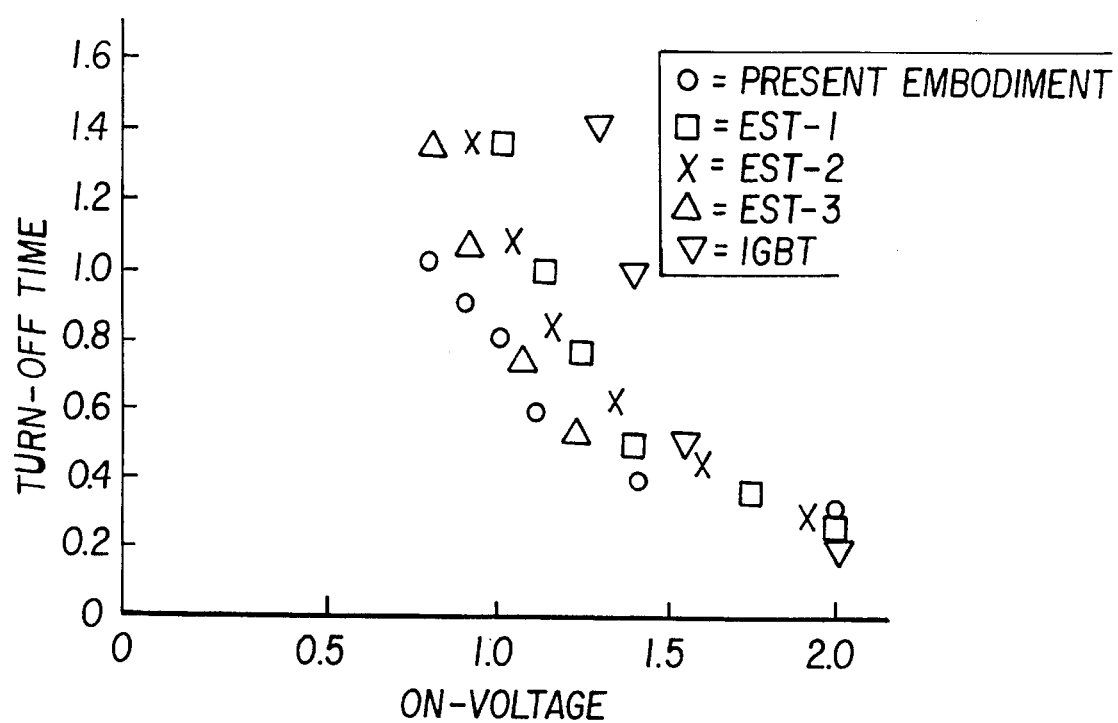
FIG. 23 is a graph comparing the trade-off relation between the on-voltage and the turn-off time of the 600 V-class device of the present invention with those of the prior art.
Figure 24:
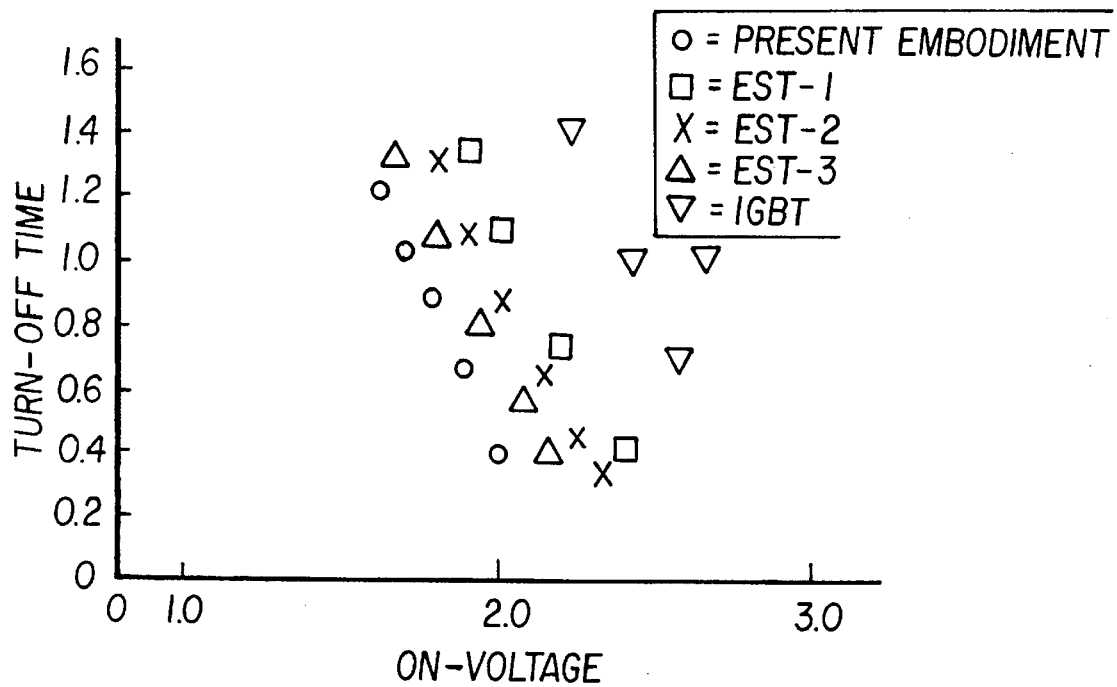
FIGS. 24 is a graph comparing the trade-off relation between the on-voltage and the turn-off time of the 2500V-class device of the present invention with those of the prior art.

The present invention effectively reduces on-voltage and improves breakdown withstand capability regardless of rated voltage of the device, and the method by which the semiconductor crystal for the substrate is grown. FIG. 22 is a voltage-current diagram which compares the RBSOA at 125° C. of the 2500 V-class insulated gate thyristor of the present invention having the structure shown in FIG. 15 with those of an EST-1, an EST-2, an EST-3, and an IGBT of 2500 V-class. In FIG. 22, the thickness of the n-layer 3 is 440 μm. The on-voltage is 1.1 V for the present device, 2.0 V for the EST-1, 2.2 V the EST-2, 1.4 V for the EST-3, and 3.3 V for the IGBT. Similarly as in the 600 V-class device and the device comprised of an epitaxial wafer, the 2500 V-class device of the present invention shows much wider RBSOA than the those of the ESTs and the IGBT. In other words. And the 2500 V-class device of the present invention shows low on-voltage. In other words, the present invention widens the RBSOA without deteriorating on-voltage and regardless of resistivity of the n$^-$ layer 3 and a current amplification factor of the PNP wide base transistor. FIGS. 23 and 24 are graphs comparing the trade-off relations between the on-voltage and the turn-off time of the 600 V-class and the 2500 V-class devices. In the figures, the on-voltage is defined by potential drop at 25° C. and at current density of 100 A/cm$^2$ for the 600V-class devices, and at current density of 50 A/cm$^2$ for the 2500 V-class devices. The turn-off time in FIGS. 23, 4 was measured at 125° C. FIGS. 23 and 24 indicates that, in these withstand voltage classes, the devices of the present invention show better trade-off relation than those of the ESTs and the IGBT.

Figure 25:
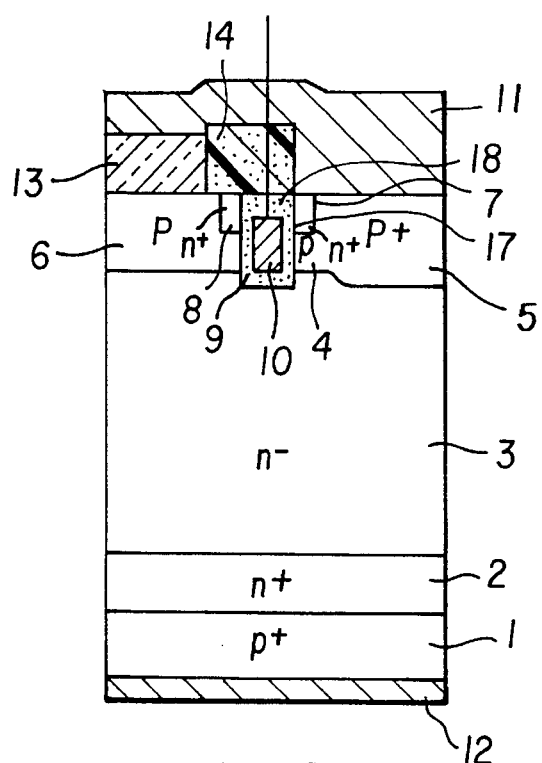
FIG. 25 is a sectional view showing the fifth embodiment of an insulated gate thyristor according to the present invention, in which the horizontal MOSFET is provided with a trench structure.

The horizontal MOSFET of the insulated gate thyristor of the present invention may be provided with a trench structure as shown in FIG. 25. In FIG. 25, an n$^+$ layer is formed in the surface layer of the p-base region by selective diffusion. A trench 17 is formed which divides the n$^+$ layer into a source region 7 and an emitter region 8. And, the gate electrode 10 is buried in insulator 9 which fills the trench 17. This structure facilitates shortening the unit cell width of 50 μm in FIGS. 3 and 4 to 40 μm, and lowering the on-voltage. The on-voltage of 1.1 V is lowered to 1.0 V in the 600 V-class device, and the on-voltage of 1.3 V is lowered to 1.1 V in the 2500 V-class device by the trench structure. In association with this, the RBSOAs are widened 1.3 times as wide as those of the laminated devices.

Figure 3:
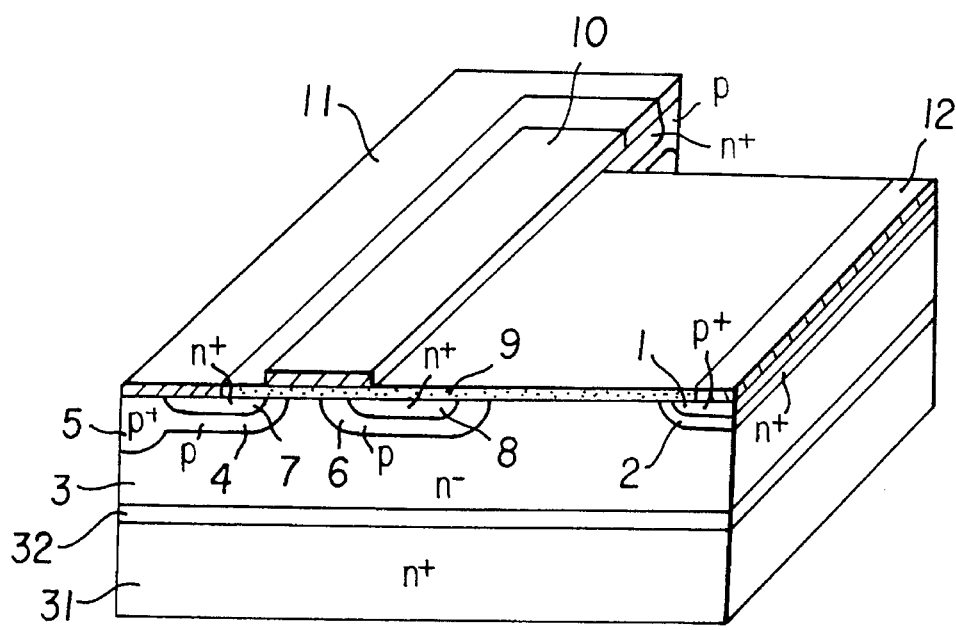
FIG. 3 is an isometric view showing a device structure of a horizontal EST according to the prior art.
Figure 26:
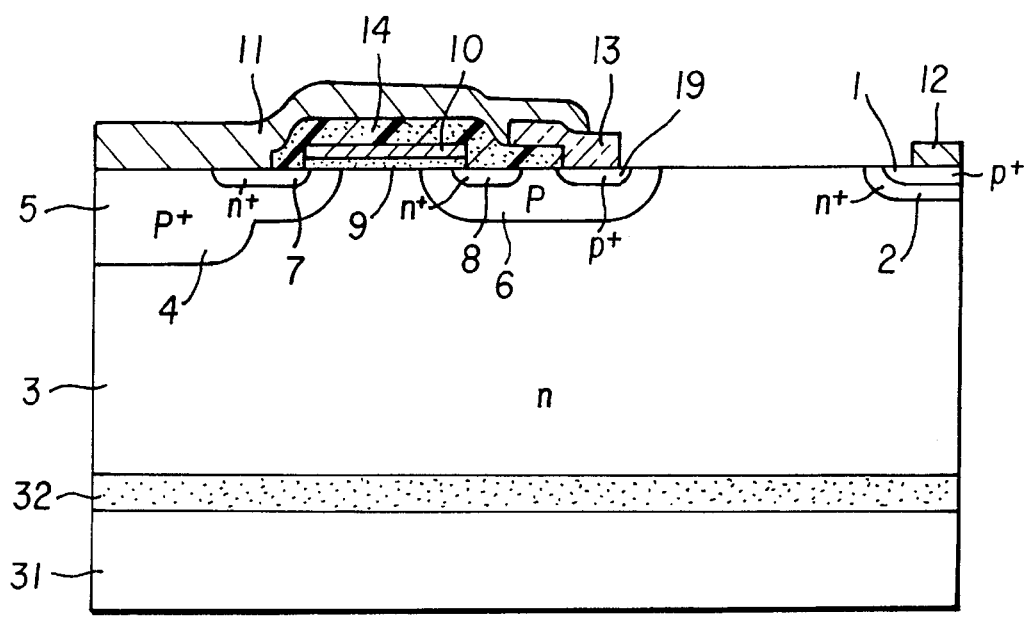
FIG. 26 is a sectional view showing an embodiment of a horizontal insulated gate thyristor (sixth embodiment) according to the present invention.
Figure 27:
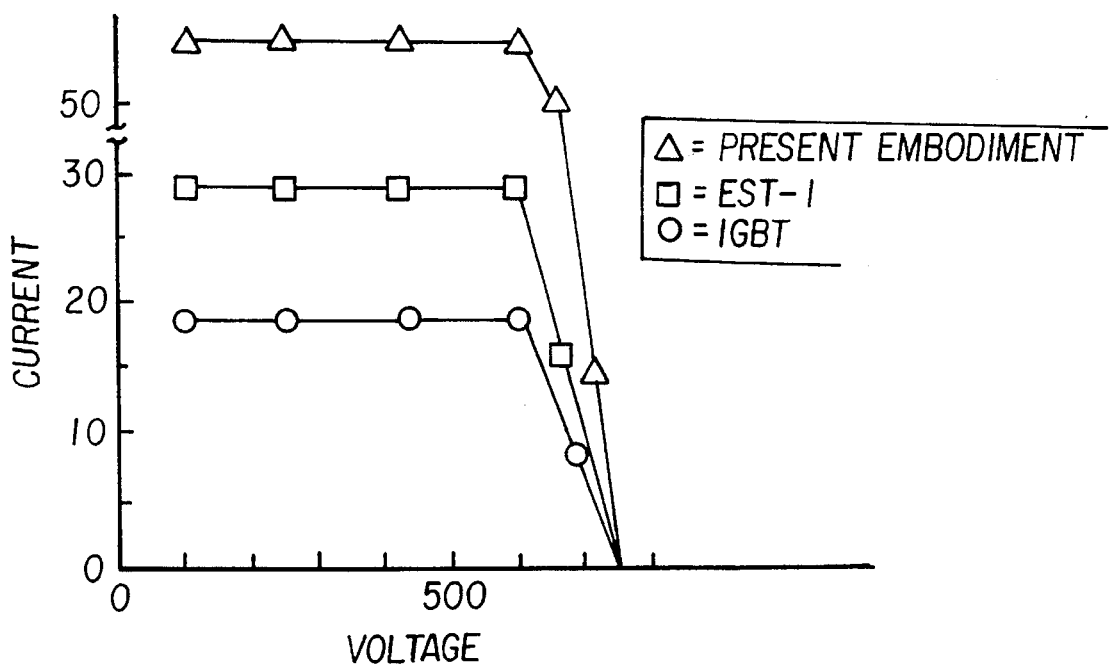
FIG. 27 is a voltage-current diagram comparing the RBSOA of the device of FIG. 26 those of a 600 V-class EST-1 and an IGBT of horizontal type.

FIG. 26 is a sectional view showing an embodiment of a horizontal insulated gate thyristor according to the present invention. In FIG. 26, the same parts with those of FIGS. 1 and 3 are designated by the same reference numerals. The device of FIG. 26 is different from the device of FIG. 3 in that a p$^+$ contact region 19 is formed by the side of the n$^+$ emitter region 8 in the surface layer of the second p-base region 6, and the cathode 11 extends above the p$^+$ contact region 19 through the polycrystalline silicon resistor 13. With this configuration, the device of FIG. 26 behaves similarly as the vertical device of FIG. 1. An experimental 600V-class device was prepared on an SOI substrate having an SiO$_2$ layer 32 of 2.0 μm in thickness. Thickness of an n$^-$ base layer 3 is 30 μm, and its impurity concentration is $1.0 \times 104^{14}$ cm$^3$. Diffusion depth is 6 μm for an n$^+$ buffer layer 2 and 1.2 μm for a p$^+$ emitter layer. FIG. 27 is a voltage-current diagram which compares the RBSOA of this device measured at 125° C. in the circuit of FIG. 14 with those of a 600 V-class EST-1 and an IGBT. On-voltage, defined by voltage drop at a current of 10 A, is 2.0 V for the device of the present invention, 2.6 V for the EST-1 and 3.3 V for the IGBT. As FIG. 27 indicates, the experimental device of the present invention shows the RBSOA three times as wide as that of the IGBT and twice as wide as that of the EST-1, and lower on-voltage than those of the EST-1 and the IGBT. This is due to that the PN junction between the n$^+$ emitter region 8 and the second p-base region 6 recovers the reverse-blocking ability uniformly over its length, and then the second p-base region 6 provides the hole current with a bypass. The present invention is applicable to insulated gate thyristors in which the first conductivity type is p-type and the second conductivity type is n-type. The present invention, which obtains potential drop through a resistor disposed between the main electrode and the base region, facilitates uniformly recovering the reverse-blocking ability of the PN junction, in contrast to the ESTs of the prior art which obtains the potential drop by the current in Z-direction for latching up the thyristor from the IGBT mode. By this measure, the voltage drive type thyristor of the present invention shows, in a wide withstand voltage range between 600 V and 2500 V or more, much better breakdown withstand capability and much better trade-off relation between the on-voltage and the turn-off time than the devices according to the prior art.

What is claimed is:

1. An insulated gate thyristor comprising:

a base layer of a first conductivity type and of high resistivity;

a first base region of a second conductivity type selectively formed in a surface layer on a first side of said base layer;

a second base region of the second conductivity type selectively formed in said surface layer of said base layer and separated from said first base region;

a source region of the first conductivity type selectively formed in a surface layer of said first base region;

an emitter region of the first conductivity type selectively formed in a surface layer if said second base region;

a gate electrode formed on insulation film above an exposed area of said first base region, an exposed area of said base layer and an exposed area of said second base region sandwiched between said source region and said emitter region;

a first main electrode contacting in common with an exposed area of said first base region and said source region;

a resistor disposed between and contacting with said first main electrode and an exposed area of said second base region, said resistor being distinct from said second base region;

an emitter layer of the second conductivity type formed on a second side of said base layer; and a second main electrode contacting with said emitter layer.

2. The insulated gate thyristor as claimed in claim 1, wherein said emitter region is wider than said source region and 25 times as wide as said source region at the maximum in a region wherein said emitter region extends parallel to said source region.

3. The insulated gate thyristor as claimed in claim 1, wherein said resistor contacts with said first electrode in an opening of insulation film sandwiched between said resistor and said first electrode, said opening being formed through said insulation film above an area of said base layer sandwiched between said source region and said emitter region.

4. The insulated gate thyristor as claimed in claim 1, wherein a contact area of said first main electrode with said first base region and said source region is formed in a shape selected from a group consisting of a polygon, a circle, and an ellipse.

5. The insulated gate thyristor as claimed in claim 1, further comprising a trench located in an area between said first base region and said second base region, wherein a bottom of said trench contacts said base layer, wherein said source region and said emitter regions are formed beside said trench, and wherein said gate electrode is located in said trench and surrounded with an insulator.

6. The insulated gate thyristor as claimed in claim 1, further comprising a trench located in an area between said first base region and said second base region, wherein a bottom of said trench contacts said base layer, wherein said source region and said emitter regions are formed beside said trench, and wherein said gate electrode is located in said trench and surrounded with an insulator.

7. The insulated gate thyristor comprising:

a base layer of a first conductivity type and of high resistivity;

a first base region of a second conductivity type selectively formed in a surface layer on a first side of said base layer;

a second base region of the second conductivity type selectively formed in said surface layer of said base layer and separated from said first base region;

a source region of the first conductivity type selectively formed in a surface layer of said first base region;

an emitter region of the first conductivity type selectively formed in a surface layer of said second base region;

a gate electrode formed on insulation film above an exposed area of said first base region, an exposed area of said base layer and an exposed area of said second base region sandwiched between said source region and said emitter region;

a first main electrode ContaCting in common with an exposed area of said first base region and said source region;

a resistor disposed between and contacting with said first main electrode and an exposed area of said second base region, wherein said resistor comprises poly-crystalline silicon;

an emitter layer of the second conductivity type formed on a second side of said base layer; and a second main electrode contacting with said emitter layer.

8. An insulated gate thyristor comprising:

a base layer of a first conductivity type and of high resistivity;

a first base region of a second conductivity type selectively formed in a surface layer on a first side of said base layer;

a second base region of the second conductivity type selectively formed in said surface layer of said base layer and separated from said first base region;

a source region of the first conductivity type selectively formed in a surface layer of said first base region;

an emitter region of the first conductivity type selectively formed in a surface layer of said second base region;

a gate electrode formed on insulation film above an exposed area of said first base region, an exposed area of said base layer and an exposed area of said second base region sandwiched between said source region and said emitter region;

a first main electrode contacting in common with an exposed area of said first base region and said source region;

a resistor disposed between and contacting with said first main electrode and an exposed area of said second base region, said resistor being distinct from said second base region;

an emitter layer of the second conductivity type formed in said surface layer on said first side of said base layer, said emitter layer being separated from said first base region and said second base region; and a second main electrode contacting with said emitter layer.

9. The insulated gate thyristor as claimed in claim 6, wherein said emitter region is wider than said source region and 25 times as wide as said source region at the maximum in a region wherein said emitter region extends parallel to said source region.

10. The insulated gate thyristor as claimed in claim 8, wherein said resistor contacts with said first electrode in an opening of insulation film sandwiched between said resistor and said first electrode, said opening being formed through said insulation film above an area of said base layer sandwiched between said source region and said emitter region.

11. The insulated gate thyristor as claimed in claim 8, wherein a contact area of said first main electrode with said first base region and said source region is formed in a shape selected from a group consisting of a polygon, a circle, and an ellipse.

12. The insulated gate thyristor comprising:

a base layer of a first conductivity type and of high resistivity;

a first base region of a second conductivity type selectively formed in a surface layer on a first side of said base layer;

a second base region of the second conductivity type selectively formed in said surface layer of said base layer and separated from said first base region;

a source region of the first conductivity type selectively formed in a surface layer of said first base region;

an emitter region of the first conductivity type selectively formed in a surface layer of said second base region;

a gate electrode formed on insulation film above an exposed area of said first base region, an exposed area of said base layer and an exposed area of said second base region sandwiched between said source region and said emitter region;

a first main electrode contacting in common with an exposed area of said first base region and said source region;

a resistor disposed between and contacting with said first main electrode and an exposed area of said second base region, wherein said resistor comprises poly-crystalline silicon;

an emitter layer of the second conductivity type formed in said surface layer on said first side of said base layer, said emitter layer being separated from said first base region and said second base region; and a second main electrode contacting with said emitter layer.

* * * * *